United States Patent
Sun et al.

(10) Patent No.: US 12,178,066 B2
(45) Date of Patent: *Dec. 24, 2024

(54) SUBSTRATE AND PREPARATION METHOD THEREOF, DISPLAY PANEL AND PREPARATION METHOD THEREOF, AND DISPLAY DEVICE

(71) Applicant: BOE TECHNOLOGY GROUP CO., LTD., Beijing (CN)

(72) Inventors: Li Sun, Beijing (CN); Wenjun Hou, Beijing (CN); Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/337,197

(22) Filed: Jun. 19, 2023

(65) Prior Publication Data

US 2023/0337459 A1 Oct. 19, 2023

Related U.S. Application Data

(63) Continuation of application No. 17/715,270, filed on Apr. 7, 2022, now Pat. No. 11,737,308, which is a
(Continued)

(30) Foreign Application Priority Data

Dec. 7, 2018 (CN) .......................... 201811496810.5

(51) Int. Cl.
*H10K 50/842* (2023.01)
*H10K 59/00* (2023.01)
(Continued)

(52) U.S. Cl.
CPC ......... *H10K 50/8426* (2023.02); *H10K 59/00* (2023.02); *H10K 59/121* (2023.02);
(Continued)

(58) Field of Classification Search
CPC ...................... H10K 50/8426; H10K 59/8722
See application file for complete search history.

(56) References Cited

U.S. PATENT DOCUMENTS 7,459,177 B2 12/2008 Kimura et al.
7,795,803 B2 9/2010 Kim et al.
(Continued)

FOREIGN PATENT DOCUMENTS

| CN | 1535079 A | 10/2004 |
| CN | 1710999 A | 12/2005 |

(Continued)

OTHER PUBLICATIONS

International Search Report of PCT/CN2019/123336 in Chinese, mailed Mar. 12, 2020, with English translation.
(Continued)

*Primary Examiner* — Victoria K. Hall
(74) *Attorney, Agent, or Firm* — Collard & Roe, P.C.; William Collard

(57) ABSTRACT

A substrate and a preparation method thereof, a display panel and a preparation method thereof, and a display device are provided. The substrate includes a display region and a peripheral region positioned in a periphery of the display region and used for sealing, the substrate includes: a base substrate; an insulating layer, arranged on a side of the base substrate and positioned in the display region and the peripheral region for sealing; and a plurality of pixel units, positioned on the insulating layer corresponding to the display region, and in the peripheral region, at least one groove is disposed on a side of the insulating layer which
(Continued)

faces away from the base substrate, a side of the groove which is away from the base substrate is open, and a depth direction of the groove is perpendicular to the base substrate.

11 Claims, 7 Drawing Sheets

Related U.S. Application Data continuation of application No. 16/765,984, filed as application No. PCT/CN2019/123336 on Dec. 5, 2019, now Pat. No. 11,335,879.

(51) Int. Cl.
  *H10K 59/121* (2023.01)
  *H10K 59/122* (2023.01)
  *H10K 59/124* (2023.01)
  *H10K 59/80* (2023.01)
  *H10K 71/00* (2023.01)
  *H10K 59/12* (2023.01)

(52) U.S. Cl.
  CPC ......... *H10K 59/122* (2023.02); *H10K 59/124* (2023.02); *H10K 59/8722* (2023.02); *H10K 71/00* (2023.02); *H10K 59/1201* (2023.02)

(56) References Cited

U.S. PATENT DOCUMENTS

| | | |
|---|---|---|
| 7,964,874 B2 | 6/2011 | Yamazaki et al. |
| 8,187,665 B2 | 5/2012 | Ishizuka et al. |
| 8,237,357 B2 | 8/2012 | Takei et al. |
| 8,304,986 B2 | 11/2012 | Yoshida et al. |
| 8,785,964 B2 | 7/2014 | Shitagaki et al. |
| 9,196,804 B2 | 11/2015 | Cho et al. |
| 9,543,542 B2 | 1/2017 | Kim et al. |
| 9,711,755 B2 | 7/2017 | Lee et al. |
| 10,541,380 B1 | 1/2020 | Sung et al. |
| 10,629,663 B2 | 4/2020 | Jung et al. |
| 10,734,603 B2 | 8/2020 | Hong et al. |
| 10,916,588 B2 | 2/2021 | Kang et al. |
| 10,950,819 B2 | 3/2021 | Kim |
| 11,088,345 B2 | 8/2021 | Zhao |
| 11,139,450 B2 | 10/2021 | Cheng |
| 11,329,248 B2 | 5/2022 | An |
| 11,335,879 B2* | 5/2022 | Sun .................. H10K 50/8426 |
| 11,552,152 B2 | 1/2023 | Shim et al. |
| 11,737,308 B2* | 8/2023 | Sun ................... H10K 59/124 |
| 2002/0057055 A1 | 5/2002 | Yamazaki et al. |
| 2002/0064966 A1 | 5/2002 | Seki et al. |
| 2003/0227021 A1 | 12/2003 | Yamazaki et al. |
| 2004/0095060 A1 | 5/2004 | Ushifusa et al. |
| 2004/0263740 A1 | 12/2004 | Sakakura et al. |
| 2005/0046346 A1 | 3/2005 | Tsuchiya et al. |
| 2005/0084994 A1 | 4/2005 | Yamazaki et al. |
| 2005/0179377 A1 | 8/2005 | Shitagami et al. |
| 2005/0218396 A1 | 10/2005 | Tsuchiya et al. |
| 2005/0260335 A1* | 11/2005 | Kimura ................. H10K 59/35 427/164 |
| 2007/0176548 A1 | 8/2007 | Kim et al. |
| 2007/0182322 A1 | 8/2007 | Nagayama |
| 2007/0291216 A1 | 12/2007 | Chan et al. |
| 2009/0273589 A1 | 11/2009 | Asano et al. |
| 2009/0278443 A1 | 11/2009 | Terada et al. |
| 2010/0227477 A1 | 9/2010 | Ito |
| 2011/0127548 A1 | 6/2011 | Lee |
| 2013/0001608 A1 | 1/2013 | Amano |
| 2013/0248834 A1* | 9/2013 | Seki ....................... H10K 59/88 257/40 |
| 2014/0183458 A1 | 7/2014 | Lee et al. |
| 2015/0001501 A1* | 1/2015 | Cho ....................... H10K 59/12 257/40 |
| 2015/0060893 A1 | 3/2015 | Cho et al. |
| 2015/0084498 A1 | 3/2015 | Choi |
| 2015/0102293 A1 | 4/2015 | Cho et al. |
| 2015/0108438 A1 | 4/2015 | Kim |
| 2015/0171367 A1 | 6/2015 | Moon |
| 2015/0185516 A1 | 7/2015 | Lee et al. |
| 2015/0221708 A1 | 8/2015 | Go et al. |
| 2015/0236297 A1 | 8/2015 | Hong et al. |
| 2015/0243705 A1 | 8/2015 | Kim |
| 2015/0279912 A1 | 10/2015 | Negishi |
| 2016/0043346 A1 | 2/2016 | Kamiya et al. |
| 2016/0104863 A1 | 4/2016 | Park |
| 2016/0111677 A1 | 4/2016 | Hong et al. |
| 2016/0164027 A1 | 6/2016 | Jeon |
| 2016/0293675 A1 | 10/2016 | Kim |
| 2016/0293883 A1 | 10/2016 | Hong et al. |
| 2017/0012243 A1 | 1/2017 | Suzuki et al. |
| 2017/0018603 A1 | 1/2017 | An |
| 2017/0148855 A1 | 5/2017 | Kaji |
| 2017/0148856 A1 | 5/2017 | Choi et al. |
| 2017/0187000 A1 | 6/2017 | Kato |
| 2017/0194599 A1 | 7/2017 | Furuie |
| 2018/0069193 A1 | 3/2018 | Hong et al. |
| 2018/0076416 A1 | 3/2018 | Cho et al. |
| 2018/0090722 A1 | 3/2018 | Kim et al. |
| 2018/0226608 A1 | 8/2018 | Nakagawa |
| 2018/0287093 A1 | 10/2018 | Lee et al. |
| 2018/0315802 A1 | 11/2018 | Kamiyama |
| 2018/0331320 A1 | 11/2018 | Su et al. |
| 2018/0337364 A1 | 11/2018 | Kwon et al. |
| 2019/0051859 A1 | 2/2019 | Choi et al. |
| 2019/0081129 A1 | 3/2019 | Sung et al. |
| 2019/0081273 A1 | 3/2019 | Sung et al. |
| 2019/0157363 A1* | 5/2019 | Lee ........................ H10K 50/81 |
| 2019/0181376 A1 | 6/2019 | Kim |
| 2019/0229176 A1 | 7/2019 | Shim et al. |
| 2019/0273122 A1 | 9/2019 | Iwasaki et al. |
| 2019/0280241 A1 | 9/2019 | Ko et al. |
| 2019/0280246 A1 | 9/2019 | Cheng |
| 2019/0334120 A1 | 10/2019 | Seo et al. |
| 2020/0006682 A1 | 1/2020 | Seo et al. |
| 2020/0083475 A1 | 3/2020 | Kang et al. |
| 2020/0091459 A1 | 3/2020 | Senoo et al. |
| 2020/0106045 A1 | 4/2020 | Han et al. |
| 2020/0152705 A1 | 5/2020 | Son et al. |
| 2020/0185660 A1 | 6/2020 | Kim et al. |
| 2020/0258952 A1 | 8/2020 | Bok et al. |
| 2021/0091337 A1 | 3/2021 | Zhao |
| 2021/0336205 A1 | 10/2021 | Wang et al. |

FOREIGN PATENT DOCUMENTS

| | | |
|---|---|---|
| CN | 102347454 A | 2/2012 |
| CN | 103915467 A | 7/2014 |
| CN | 104253241 A | 12/2014 |
| CN | 106299154 A | 1/2017 |
| CN | 106876328 A | 6/2017 |
| CN | 107293565 A | 10/2017 |
| CN | 208889659 A | 5/2019 |
| WO | 2010/007656 A1 | 1/2010 |

OTHER PUBLICATIONS

Notice of Transmittal of the International Search Report of PCT/CN2019/123336 in Chinese, mailed Mar. 12, 2020.
Written Opinion of the International Searching Authority of PCT/CN2019/123336 in Chinese, mailed Mar. 12, 2020, with English translation.
U.S. Office Action in U.S. Appl. No. 16/765,984 dated Sep. 27, 2021.
Notice of Allowance in U.S. Appl. No. 16/765,984 dated Jan. 25, 2022.
U.S. Office Action in U.S. Appl. No. 17/715,270 dated Oct. 25, 2022.
Final Office Action in U.S. Appl. No. 17/715,270 dated Feb. 16, 2023.
Notice of Allowance in U.S. Appl. No. 17/715,270 dated May 4, 2023.

(56) References Cited

OTHER PUBLICATIONS

Chinese Office Action in Chinese Application No. 201811496810.5 dated Oct. 8, 2024 with English translation.

* cited by examiner

SUBSTRATE AND PREPARATION METHOD THEREOF, DISPLAY PANEL AND PREPARATION METHOD THEREOF, AND DISPLAY DEVICE

CROSS REFERENCE TO RELATED APPLICATIONS

This application is a Continuation Application of U.S. patent application Ser. No. 17/715,270 filed on Apr. 7, 2022 (U.S. Pat. No. 11,737,308, issued Aug. 22, 2023), which is Continuation Application of U.S. patent application Ser. No. 16/765,984 filed on May 21, 2020 which is the National Stage of PCT/CN2019/123336 filed on Dec. 5, 2019, which claims priority under 35 U.S.C. § 119 of Chinese Application No. 201811496810.5 filed on Dec. 7, 2018, the disclosure of which is incorporated by reference.

TECHNICAL FIELD

Embodiments of the present disclosure relate to a substrate and a preparation method thereof, a display panel and a preparation method thereof, and a display device.

BACKGROUND

A display panel may include an array substrate and an opposed substrate which is opposite to the array substrate and is used for packaging and protection. The array substrate includes a plurality of pixel units for display and functional structures such as a driving circuit for driving the pixel units to emit light and the like. The opposed substrate is bonded with the array substrate by a sealant so as to provide packaging and protection for the pixel units and the functional structures such as the driving circuit and the like on the array substrate.

SUMMARY

At least one embodiment of the present disclosure provides a substrate comprising a display region and a peripheral region positioned in a periphery of the display region and used for sealing, the substrate comprises: a base substrate; an insulating layer, arranged on a side of the base substrate and positioned in the display region and the peripheral region for sealing; and a plurality of pixel units, positioned on the insulating layer corresponding to the display region, and in the peripheral region, at least one groove is disposed on a side of the insulating layer which faces away from the base substrate, a side of the groove which is away from the base substrate is open, and a depth direction of the groove is perpendicular to the base substrate.

For example, in the substrate provided by at least one embodiment of the present disclosure, the peripheral region for sealing is a sealant set region, and each of the plurality of pixel units includes: a light-emitting element layer which is arranged on a side of the insulating layer which faces away from the base substrate and includes a light-emitting layer.

For example, in the substrate provided by at least one embodiment of the present disclosure, an extending direction of the groove is parallel to a plane where the base substrate is positioned, and on a plane perpendicular to the base substrate, a longitudinal cross-section of the groove is of a regular trapezoid or inverted trapezoid shape.

For example, the substrate provided by at least one embodiment of the present disclosure further comprises: a pixel definition layer positioned on the insulating layer corresponding to the display region and includes a plurality of pixel openings for defining the plurality of pixel units, the light-emitting layer at least covering the plurality of pixel openings, and an extending direction of the groove is identical with an extending direction of the pixel opening.

For example, in the substrate provided by at least one embodiment of the present disclosure, a shape and a size of an end of the groove away from the base substrate are identical with shapes and sizes of ends of the plurality of pixel openings away from the base substrate; or the shape of the end of the groove away from the base substrate is identical with the shapes of the ends of the plurality of pixel openings away from the base substrate, the size of the end of the groove away from the base substrate is greater than sizes of the ends of the plurality of pixel openings away from the base substrate.

For example, in the substrate provided by at least one embodiment of the present disclosure, the insulating layer includes a plurality of grooves in the peripheral region, extending directions of the plurality of grooves are identical, the plurality of grooves are arranged into a plurality of rows and a plurality of columns in the periphery of the display region, a row direction of the grooves is identical with a row direction of the plurality of pixel openings, and a column direction of the grooves is identical with a column direction of the pixel openings, a shape of an end of the groove away from the base substrate is identical with shapes of ends of the plurality of pixel openings away from the base substrate, sizes of the ends of the plurality of grooves away from the base substrate are equal to sizes of the ends of the plurality of pixel openings away from the base substrate, or the sizes of the ends of at least one portion of the plurality of grooves away from the base substrate are greater than the sizes of the ends of the plurality of pixel openings away from the base substrate.

For example, in the substrate provided by at least one embodiment of the present disclosure, the sizes of the ends of the plurality of grooves away from the base substrate are equal to the sizes of the ends of the plurality of pixel openings away from the base substrate, the shapes of the plurality of grooves are identical and the sizes of the plurality of grooves are identical, a pitch of the grooves in the row direction is identical with a pitch of the pixel openings in the row direction and/or a pitch of the grooves in the column direction is identical with that of the pixel openings in the column direction.

For example, in the substrate provided by at least one embodiment of the present disclosure, the plurality of grooves are divided into two groups according to different lengths, a width of each of the plurality of grooves is equal to a width of the pixel opening, the length of a groove in one group of the two groups is equal to a sum of pitches of the plurality of pixel openings along the column direction, the grooves in the one group of the two groups are arranged on both sides of the display region along the row direction of the pixel opening, the length of a groove in other group of the two groups is equal to or greater than a length of each of the plurality of pixel openings, the grooves in the other group are arranged on both sides of the display region in the column direction, and a pitch of the plurality of grooves along the row direction are identical with the pitch of the plurality of pixel openings along the row direction.

For example, in the substrate provided by at least one embodiment of the present disclosure, a surface of the insulating layer which is positioned in the peripheral region has lyophobicity.

For example, in the substrate provided by at least one embodiment of the present disclosure, at least one portion of the light-emitting layer is positioned in the groove.

For example, in the substrate provided by at least one embodiment of the present disclosure, the insulating layer includes: a first sub insulating layer, having a first groove portion; and a second sub insulating layer, laminated on the first sub insulating layer and having an opening communicating with the first groove portion, and the first groove portion and the opening constitutes the groove.

For example, in the substrate provided by at least one embodiment of the present disclosure, a longitudinal cross-section of the first groove portion is of a regular trapezoid shape, and a longitudinal cross-section of the opening is of an inverted trapezoid or rectangle shape.

For example, in the substrate provided by at least one embodiment of the present disclosure, a material of the first sub insulating layer includes a negative photoresist material, and a material of the second sub insulating layer includes a positive photoresist material or an inorganic material.

For example, the substrate provided by at least one embodiment of the present disclosure further comprises a driving circuit positioned on the base substrate in the display region and configured to drive the plurality of pixel units, and the insulating layer covers the driving circuit.

At least one embodiment of the present disclosure provides a display panel, the display panel comprises: the substrate as mentioned above; an opposed substrate, arranged to be opposite to the substrate; and a sealant, disposed between the substrate and the opposed substrate, and the sealant covers the groove and bonds the opposed substrate with the substrate.

At least one embodiment of the present disclosure provides a preparation method of a substrate, the substrate includes a display region and a peripheral region which is positioned in a periphery of the display region and used for sealing, the preparation method comprises: providing a base substrate; forming an insulating layer in the display region and the peripheral region and on a side of the base substrate; and forming at least one groove in the peripheral region and on a side of the insulating layer faces away from the base substrate, a side of the groove away from the base substrate being open, a depth direction of the groove being perpendicular to the base substrate, and the substrate includes a plurality of pixel units, and the plurality of pixel units are positioned on the insulating layer corresponding to the display region.

For example, in the preparation method provided by at least one embodiment of the present disclosure, the insulating layer is configured that at least a surface of the insulating layer in the peripheral region has lyophobicity.

For example, the preparation method provided by at least one embodiment of the present disclosure further comprises: forming a pixel definition layer, the pixel definition layer including a plurality of pixel openings respectively used for the plurality of pixel units; and forming a light-emitting layer, the light-emitting layer at least covering the plurality of pixel openings, and the light-emitting layer is formed by using an ink-jet printing, spin-coating or spray-coating mode, and at least one portion of the light-emitting layer is formed in the groove.

For example, in the preparation method provided by at least one embodiment of the present disclosure, the forming the insulating layer includes: forming a first sub insulating layer, the first sub insulating layer having a first groove portion; and forming a second sub insulating layer on the first sub insulating layer, the second sub insulating layer having an opening communicating with the first groove portion, and the first groove portion and the opening constitute the groove.

For example, in the preparation method provided by at least one embodiment of the present disclosure, the second sub insulating layer is formed by adopting a material with lyophobicity, or a surface of the second sub insulating layer which is positioned in the peripheral region is subjected to surface treatment, so that the surface of the second sub insulating layer which is positioned in the peripheral region has lyophobicity.

For example, in the preparation method provided by at least one embodiment of the present disclosure, the surface treatment is carried out by adopting plasmas of Ar, N2, CF4 or O2.

At least one embodiment of the present disclosure provides a preparation method of the display panel, the preparation method of the display panel comprises: manufacturing the substrate, the substrate being prepared by any of the preparation method as mentioned above; and providing an opposed substrate, and bonding the opposed substrate on the substrate by a sealant, and the sealant covers the groove.

At least one embodiment of the present disclosure provides a display device, the display device comprises the display panel as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Generally speaking, in one type of structure of a display panel, an opposed substrate and an array substrate are bonded with each other by a sealant, so that the opposed substrate and the sealant completely isolate a pixel unit and functional structures such as a driving circuit and the like in a display region of the array substrate from the external environment so as to avoid a case that impurities such as water, oxygen and the like enter the display region, thereby prolonging the working life of the display panel. For example, FIG. 1A and FIG. 1B show an ideal display panel structure.

Figure 1A:
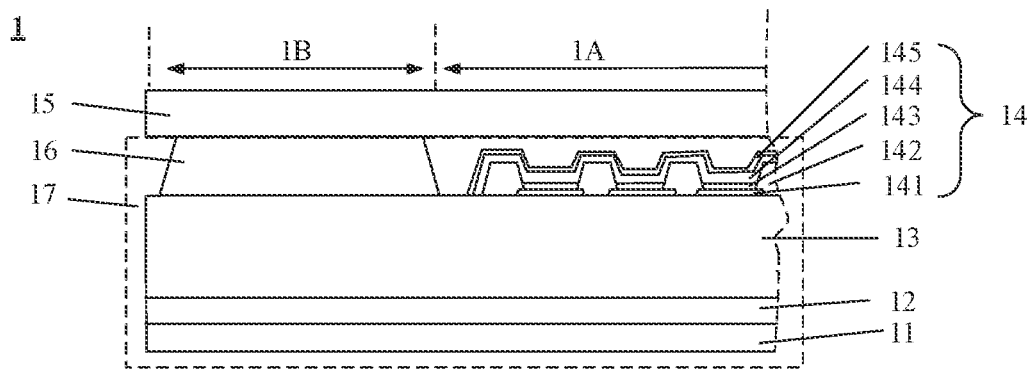
FIG. 1A is a cross-sectional schematic diagram of a display panel.
Figure 1B:
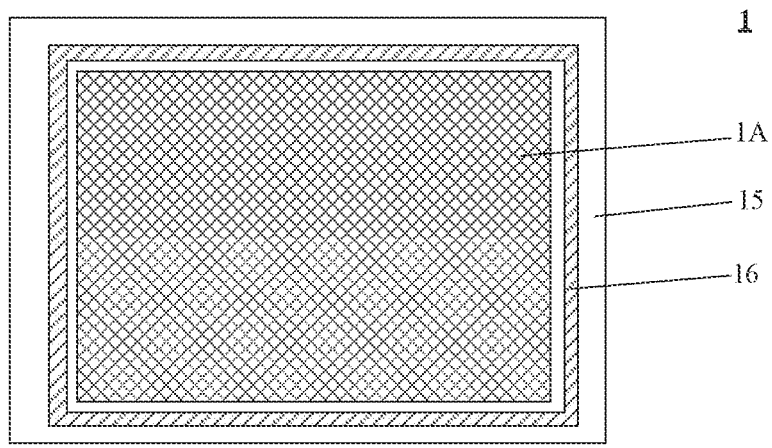
FIG. 1B is a plane schematic diagram of a display panel.

As shown in FIG. 1A and FIG. 1B, a display panel 1 has a display region 1A and a peripheral region 1B for sealing the display region 1A, the display panel 1 includes an array substrate 17 and an opposed substrate 15, the array substrate 17 includes a base substrate 11 and a driving circuit 12, an insulating layer 13 and a light-emitting element layer 14 on the base substrate 11, and the opposed substrate 15 is bonded on the insulating layer 13 by a sealant 16 so as to be bonded on the array substrate and carry out sealing on the display region 1A. As shown in FIG. 1A and FIG. 1B, the sealant 16 completely surrounds the light-emitting element layer 14, and thus, the opposed substrate 15 and the sealant 16 completely isolate the light-emitting element layer 14 from the external environment.

Figure 2:
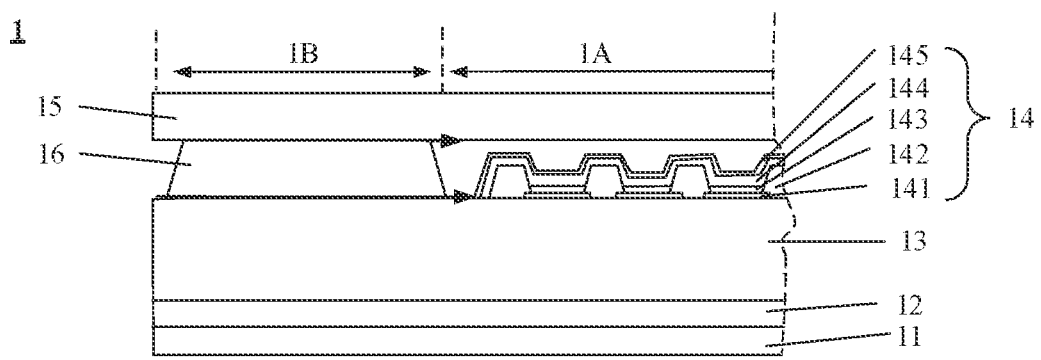
FIG. 2 is a schematic diagram of an enter path of impurities such as water, oxygen and the like in a display panel.

According to the structure, as shown in FIG. 2, there are routes (shown as arrows on both upper and lower sides of the sealant 16) for the impurities such as water, oxygen and the like to enter the display region 1A only on both the upper and lower sides of the sealant 16 in the display panel 1, and thus, the display panel 1 has a good packaging effect.

Figure 3A:
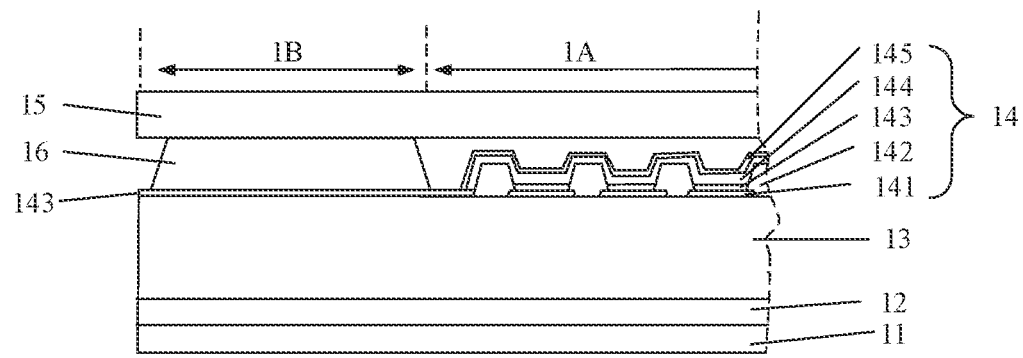
FIG. 3A is a cross-sectional schematic diagram of another display panel.
Figure 3B:
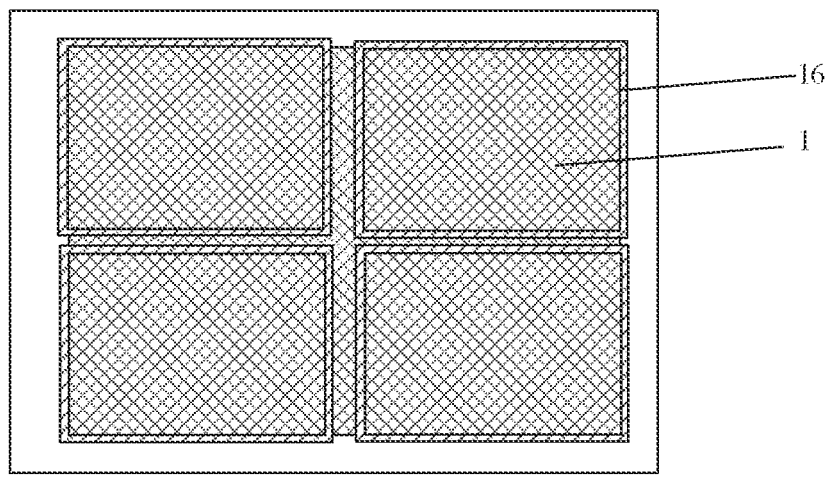
FIG. 3B is a plane schematic diagram of another display panel.

However, in an actual preparation process, as shown in FIG. 3A and FIG. 3B, a portion of functional layers of the light-emitting element layer 14 (for example, a light-emitting layer, a common electrode and the like) often adopt a full-surface forming mode, and thus, not only the display region is covered, but also the peripheral region may be covered. At the moment, in some examples, as shown in FIG. 3B, a plurality of display panels may be formed in a one-time preparation process. For example, the light-emitting element layer 14 includes structures, such as a first electrode 141, a pixel definition layer 142 with a plurality of pixel openings, a light-emitting layer 143 at least formed in the plurality of pixel openings, a second electrode 144, a passivation layer 145 and the like. For example, the structures, such as the light-emitting layer 143 and the like, in the light-emitting element layer 14 adopt a full-surface forming mode, as shown in FIG. 3A, so that the light-emitting layer 143 is also formed in the peripheral region 1B for sealing, resulting in that when the opposed substrate 15 is formed by adopting the sealant 16 at the later stage, the sealant 16 is formed (for example, coated) on the light-emitting layer 143 without direct contact with the insulating layer 13.

Figure 4:
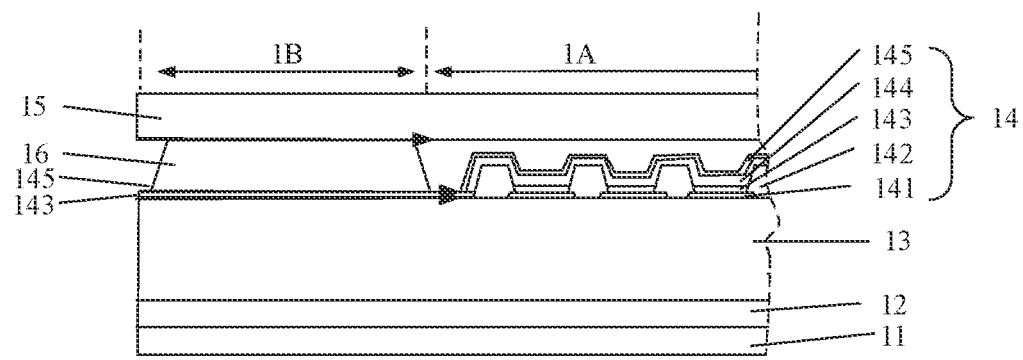
FIG. 4 is a schematic diagram of an enter path of impurities such as water, oxygen and the like in another display panel.

As shown in FIG. 4, under the case, routes for the impurities such as water, oxygen and the like to enter the display region 1A are also formed on the light-emitting layer 143 in the peripheral region 1B and on both upper and lower sides of the light-emitting layer 143 in the display panel, so that the packaging effect of the display panel is reduced.

At least one embodiment of the present disclosure provides a substrate, including a display region and a peripheral region positioned in the periphery of the display region and used for sealing. The substrate includes: a base substrate; an insulating layer, arranged on a side of the base substrate and positioned in the display region and the peripheral region for sealing; and a plurality of pixel units, positioned on the insulating layer corresponding to the display region, wherein in the peripheral region, at least one groove is disposed on a side of the insulating layer, which faces away from the base substrate, a side of the groove, which is away from the base substrate, is open, and a depth direction of the groove is perpendicular to the base substrate.

At least one embodiment of the present disclosure provides a preparation method of a substrate. The substrate includes a display region and a peripheral region positioned in the periphery of the display region and used for sealing. The preparation method includes: providing a base substrate; forming an insulating layer in a display region and a peripheral region and on a side of the base substrate; and forming at least one groove in the peripheral region and on a side of the insulating layer, which faces away from the base substrate, a side of the groove, which is away from the base substrate, being open, a depth direction of the groove being perpendicular to the base substrate, wherein the substrate includes a plurality of pixel units, and the plurality of pixel units are positioned on the insulating layer corresponding to the display region.

At least one embodiment of the present disclosure provides a display panel, and the display panel includes the above-mentioned substrate.

At least one embodiment of the present disclosure provides a display device, and the display device includes the above-mentioned display panel.

The substrate and the preparation method thereof, the display panel and the preparation method thereof and the display device of the present disclosure will be illustrated below by several specific embodiments.

Figure 5A:
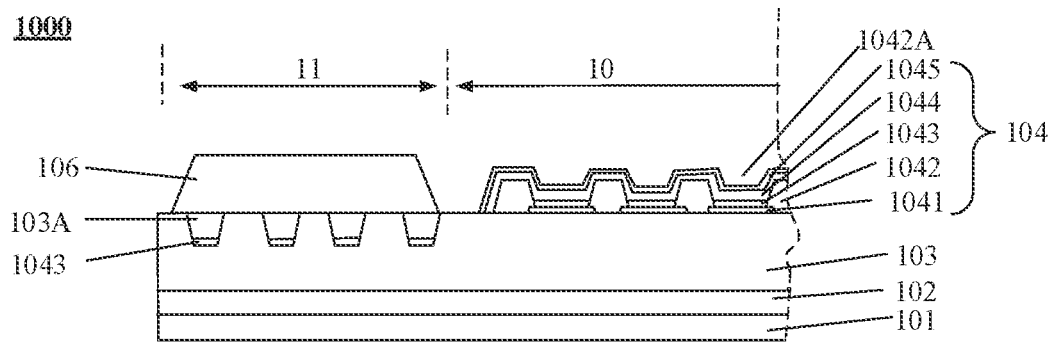
FIG. 5A is a cross-sectional schematic diagram of a substrate provided by some embodiments of the present disclosure.
Figure 5B:
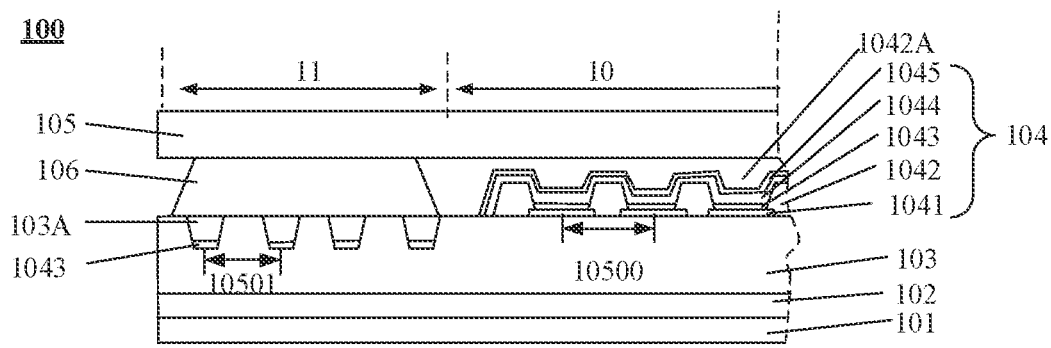
FIG. 5B is a cross-sectional schematic diagram of a display panel provided by some embodiments of the present disclosure.
Figure 5C:
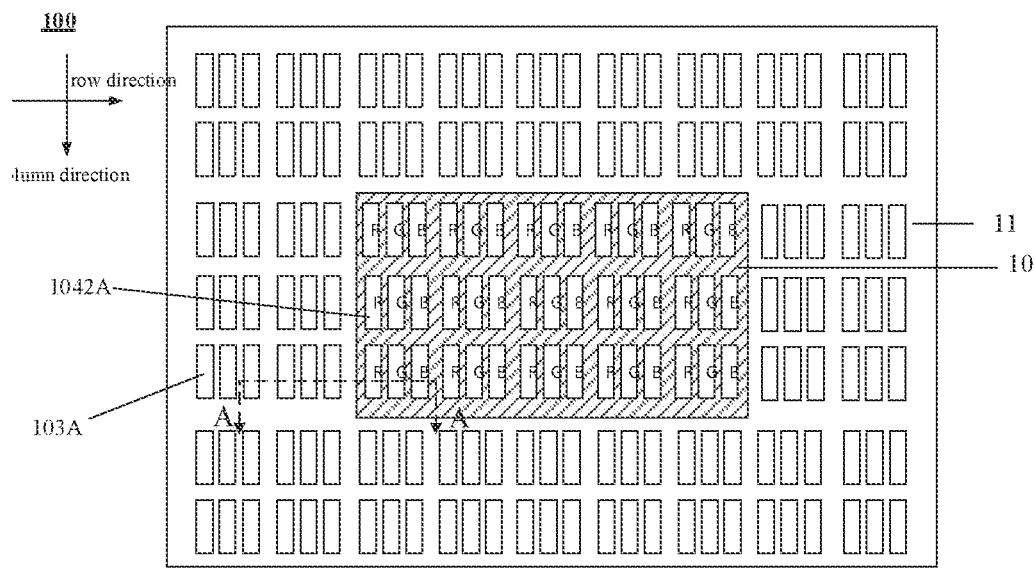
FIG. 5C is a plane schematic diagram of a display panel provided by some embodiments of the present disclosure.

At least one embodiment of the present disclosure provides a display panel, FIG. 5A is a cross-sectional schematic diagram of a substrate 1000, and FIG. 5C is a plane schematic diagram of the display panel, wherein FIG. 5B is a cross-sectional schematic diagram of the display panel in FIG. 5C along an A-A line.

The display panel includes an array substrate and an opposed substrate, the array substrate includes a base substrate, a driving circuit formed on the base substrate, an insulating layer covering the driving circuit and a light-emitting element layer on the insulating layer, and the opposed substrate is bonded on the insulating layer of the array substrate in a peripheral region by a sealant so as to carry out sealing on a display region. The display region includes a plurality of pixel units, and in each pixel unit, the driving circuit includes a pixel driving circuit, the light-emitting element layer includes a light-emitting element, and the pixel driving circuit drives the light-emitting element electrically connected therewith to emit light.

As shown in FIGS. 5B and 5C, the substrate 1000 includes the display region 10 and the peripheral region 11 positioned in the periphery of the display region and used for sealing, and the substrate 1000 includes: the base substrate 101; the insulating layer 103, which is arranged on a side of the base substrate 101 and positioned in the display region and the peripheral region for sealing; and a plurality of pixel units, which are positioned on the insulating layer 103 corresponding to the display region, wherein in the peripheral region, at least one groove 103A is disposed on a side of the insulating layer, which faces away from the base substrate, a side of the groove 103A, which is away from the base substrate 101, is open, and a depth direction of the groove 103A is perpendicular to the base substrate.

For example, in the embodiment, the peripheral region for sealing is a sealant disposing region, and each of the plurality of pixel units (RIG/B) includes: the light-emitting element layer 104, which is arranged on a side of the insulating layer 103, which faces away from a base, and includes a light-emitting layer 1043.

For example, in the embodiment, the substrate 1000 further includes a pixel definition layer 1042, the pixel definition layer 1042 includes a plurality of pixel openings 1042A respectively used for the plurality of pixel units, the light-emitting layer 1043 at least covers the plurality of pixel openings 1042A, i.e., the plurality of pixel units share the light-emitting layer 1043, or the plurality of pixel units are separately provided with the respective light-emitting layers, and the embodiments of the present disclosure do not make any limit to it. For example, corresponding to each pixel unit, the light-emitting element layer 104 further includes a first electrode 1041 and a second electrode 1044 for driving the light-emitting layer 1043 to emit light, i.e., the first electrode 1041, the second electrode 1044 and the light-emitting layer 1043 sandwiched therebetween constitute a light-emitting element, and the light-emitting layer may be an organic light-emitting layer or a quantum dot light-emitting layer, and thus, the obtained light-emitting element may be an Organic Light-Emitting Diode (OLED) or a Quantum dot Light-Emitting Diode (QLED). Moreover, the light-emitting element layer 104 further may include a passivation layer 1045 covered on the light-emitting layer 1043 so as to form packaging and protection.

For example, in this embodiment, an extending direction of the groove is parallel to a plane where the base is positioned, and on a plane perpendicular to the base, a longitudinal cross-section of the groove is of a regular trapezoid or inverted trapezoid shape.

For example, the longitudinal cross-section of the groove 103A may be of a regular trapezoid shape with a narrow upper portion and a wide lower portion (a trapezoid of which a bottom edge is longer than a top edge), so that the groove 103A can have a high volume. In addition, as shown in FIG. 5A, the longitudinal cross-section of the groove 103A also may be of an inverted trapezoid shape with a wide upper portion and a narrow lower portion (a trapezoid of which a bottom edge is shorter than a top edge), so as to benefit to fluid inflow. In some embodiments, the groove 103A further may be of a shape of a rectangular with the same width of the upper and lower portions and the like, and the embodiments of the present disclosure do not make specific limit to it.

For example, in the preparation process of the display panel provided by some embodiments of the present disclosure, the light-emitting layer 1043 is formed by using a full-surface forming mode and for example, by using printing modes of ink-jet printing, spin-coating, spray-coating and the like, and thus, a material of the light-emitting layer 1043 can flow to the peripheral region 11 for sealing, and at the moment, the groove 103A in the insulating layer 103 may collect the material of the light-emitting layer 1043, which flows to the peripheral region 11, so that the material of the light-emitting layer 1043, which remains on the insulating layer 103 in the peripheral region 11, is reduced, the material of the light-emitting layer 1043 cannot remain on the insulating layer 103 in the peripheral region 11, or residual portions of the material of the light-emitting layer 1043 are spaced from each other, and thus, a path for impurities such as water, oxygen and the like to enter the display region 10 is disconnected. It will be illustrated below by taking a case that the material of the light-emitting layer cannot remain on the insulating layer 103 in the peripheral region 11 as an example. At the moment, in some embodiment, the light-emitting layer 1043 at least partially extends into the groove 103A.

For example, in the embodiment, a surface of the insulating layer 103, which is positioned in the peripheral region 11, has lyophobicity. For example, the insulating layer 103 is formed by adopting a material with lyophobicity, or the surface of the insulating layer 103, which is positioned in the peripheral region 11, is subjected to surface treatment so as to have lyophobicity. At the moment, the surface of the insulating layer 103, which has lyophobicity, can promote the material of the light-emitting layer 1043 to flow into the groove 103A, so that the material of the light-emitting layer 1043, which flows to the peripheral region 11, sufficiently flows into the groove 103A and is accommodated in the groove 103A, thereby ensuring that the material of the light-emitting layer 1043 may not remain on the insulating layer 103 in the peripheral region 11.

Figure 6:
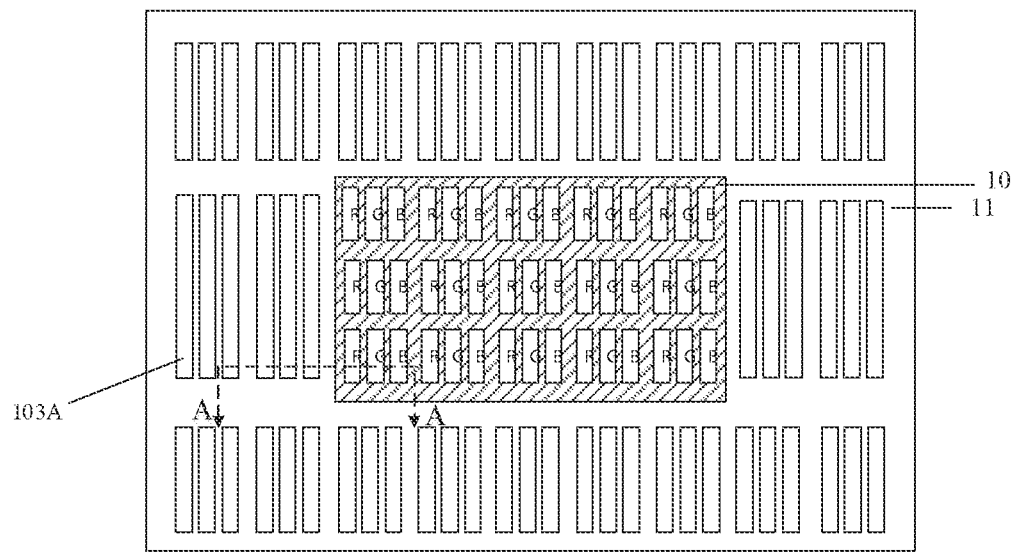
FIG. 6 is a plane schematic diagram of another display panel provided by some embodiments of the present disclosure.

For example, in some embodiments, as shown in FIG. 5C, the groove 103A and the pixel opening 1042A are the same in plane shape and size, the plane shape herein refers to a shape of uppermost portions of the groove and the pixel opening, and that is to say, the plane shape and size herein refer to a plane shape and a size of an end of the groove which is away from the substrate and plane shapes and sizes of ends of the plurality of pixel openings which is away from the substrate, that is, a plane shape and a size of upper ends of the groove and the plurality of pixel openings. Or, as shown in FIG. 6, the shape of an end of the groove which is away from the base is the same with that of ends of the plurality of pixel openings which are away from the base, the plane size of the groove 103A is greater than that of the pixel opening 1042A, and for example, a length and/or a width of the groove 103A is greater than a length and/or a width of the pixel opening 1042A. In the embodiments of the present disclosure, the plane shapes of the groove 103A and the pixel opening 1042A refer to shapes of the groove 103A and the pixel opening 1042A, which are shown in plane diagrams of the groove 103A and the pixel opening 1042A, i.e., shapes of the uppermost portions of the groove 103A and the pixel opening 1042A, for example, as shown in FIG. 5B and FIG. 6, the plane shapes of the groove 103A and the pixel opening 1042A are rectangles, in other embodiments, the plane shapes of the groove 103A and the pixel opening 1042A also may be circles, ovals or irregular shapes and the like, and the embodiments of the present disclosure do not make any specific limit to it. The plane sizes of the groove 103A and the pixel opening 1042A refer to sizes (for example, a length, a width and the like) of the shapes of the groove 103A and the pixel opening 1042A, which are shown in the plane diagrams of the groove 103A and the pixel opening 1042A, i.e., the shapes of the uppermost portions of the groove 103A and the pixel opening 1042A, at the same dimension, e.g., the sizes of the length and the width of the rectangle shape or an area of the rectangle shape, as shown in FIG. 5C and FIG. 6. In this embodiment, the plane shapes and the plane sizes of the groove 103A and the pixel opening 1042A may be selected according to actual demands, for example, in some embodiments, the plane size of the groove 103A also may be smaller than that of the pixel opening 1042A, and the embodiments of the present disclosure do not make any specific limit to it.

For example, in some embodiments, the insulating layer 103 includes a plurality of grooves 103A in the peripheral region 11, and the plurality of grooves 103A are arranged around the display region 10. The plurality of grooves are the same in an extending direction, the plurality of grooves are arranged into a plurality of rows and a plurality of columns in the periphery of the display region, a row direction of the grooves is the same with that of the plurality of pixel openings, a column direction of the grooves is the same with that of the pixel opening, the shapes of ends of the plurality of grooves which are away from the base are the same and are also the same with those of ends of the plurality of pixel openings which are away from the base, the sizes of the ends of the plurality of grooves which are away from the base are all equal to those of the ends of the plurality of pixel openings which are away from the base, or the sizes of ends of at least one portion of the plurality of grooves which are away from the base are greater than those of the ends of the plurality of pixel openings which are away from the base, and for example, the sizes of one portion are equal to those of the pixel openings, and the sizes of the other portion are greater than or smaller than those of the pixel openings; or all the sizes of the grooves are greater than or smaller than those of the pixel openings; and the sizes of one portion are equal to those of the pixel openings, the sizes of another portion are smaller than those of the pixel openings, and the sizes of the rest portions are greater than those of the pixel openings.

For example, as shown in FIG. 5C, the sizes of the ends of the plurality of grooves which are away from the base are equal to those of the ends of the plurality of pixel openings which are away from the base, i.e., the lengths and the widths of the upper portions of the plurality of grooves are equal to the lengths and the widths of the upper portions of the pixel openings; the plurality of grooves are the same in shape and size; a pitch 10501 of the grooves in a row direction is the same with a pitch 10500 of the pixel openings in the row direction and/or a pitch of the grooves in a column direction is the same with a pitch of the pixel openings the column direction; a pitch of the grooves positioned at edges on both left and right sides of the pixel units may be regarded as a pitch between the groove and the pixel opening, and that is to say, as shown in FIG. 5C, the plurality of pixel openings 1042A are arranged in a first array, the plurality of grooves 103A are arranged in a second array, the first array and the second array have the same arrangement direction and have the same pitch in the arrangement direction, i.e., the plurality of pixel openings 1042A and the plurality of grooves 103A adopt the basically same arrangement mode. For example, when the plane shapes of the groove 103A and the pixel opening 1042A are rectangles, the rectangles are the same in a length extending direction and a width extending direction, a spacing between the adjacent grooves 103A is basically the same with that between the adjacent pixel opening 1042A, the spacing herein refers to a distance between edges of the adjacent grooves in the row direction or the column direction, and the pitch refers to a distance between centers of the adjacent grooves in the row direction or the column direction. Viewing from the plane diagram, the groove and the pixel opening constitute the array together, the groove and the pixel opening constitute an unit of the array together, and pitches between the units are the same. Viewing from the plane diagram, the pitch of the grooves are the same with those of the pixel openings, so that an apparatus parameters and a process parameter, e.g., a step pitch, a nozzle pitch and the like, of the light emitting layer and other light-emitting functional layers do not need to be transformed, and the light-emitting layer in the sealant set region can all fall into the groove, thereby achieving an excellent sealing effect.

Optionally, it may be that the pitch, shape and size of a portion of the grooves are the same with those of the pixel openings, so that a portion of the light-emitting layer in the sealant set region can all fall into the groove, the sealing effect also can be improved, and the embodiments of the present disclosure do not make any limit to it.

Optionally, the size and the shape of a random position of the groove may be equal to the sizes and the shapes of corresponding positions of the plurality of pixel openings, for example, the size and the shape of a middle depth position of the groove is equal to the size and the shape of the middle depth position of the pixel opening, and those skilled in the art may set as required.

For further example, as shown in FIG. 6, the second array formed by the plurality of grooves 103A is different from the first array formed by the plurality of pixel openings 1042A, the plane size of the groove 103A is different from that of the pixel opening 1042A, and the pitch of the array also may be different. The plurality of grooves are divided into two groups according to the length, the widths of the plurality of grooves are equal to that of the pixel opening, the lengths of the grooves of one of the two groups are equal to or slightly smaller than a sum of the pitches of the plurality of pixel openings along the column direction, the one group of grooves are arranged on both sides of the display region along the row direction of the pixel opening, the lengths of the grooves of the other group of the two groups are equal to or greater than those of the plurality of pixel openings, the other group of grooves are arranged on both sides of the display region in the column direction, the pitch of the plurality of grooves along the row direction is the same with that of the plurality of pixel openings along the row direction, and herein, the pitch of the grooves positioned at edges of both the left and right sides of the pixel units may be regarded as the pitch between the groove and the pixel opening.

Optionally, in the second array including the plurality of grooves 103A, the plurality of grooves 103A may be arranged in an irregular row and column mode, and for example, the grooves 103A in the adjacent rows are staggered with each other by half the length in the row direction.

Under the above-mentioned setting, when the light-emitting layer 1043 is formed in the pixel opening 1042A, the groove 103A in the peripheral region 11 can collect the material of the light-emitting layer 1043 formed on the insulating layer 103 in the peripheral region 11 so as to avoid or reduce the material of the light-emitting layer 1043, which remains on the insulating layer 103 in the peripheral region 11.

For example, in the embodiments of the present disclosure, a material of the insulating layer 103 includes inorganic materials such as SiOx, SiNx, $Al_2O_3$ and the like, or includes organic materials such as polyimide (PI), polyacrylate or phenolic resin and the like, and the embodiments of the present disclosure do not make any specific limit to it.

As shown in FIG. 5A, for example, the substrate provided by the embodiments of the present disclosure further includes the base substrate 101 and the driving circuit 102. The base substrate 101 is used for supporting structures and members in the display region 10 and the peripheral region 11; and the driving circuit 102 is positioned on the base substrate 101 and used for driving a plurality of pixel units. For example, the driving circuit 102 includes the pixel driving circuit for the pixel unit, the pixel driving circuit includes structures such as a thin film transistor, a capacitor and the like, may be formed in a form of 2T1C (i.e., two transistors and one capacitor) and also may be formed in a form of 3T1C and the like, for example, when a light-emitting member of a light-emitting member layer is driven to emit light, functions of compensation, resetting and the like also may be provided, the driving circuit 102 further includes signal lines such as a gate line, a data line and the like, and the embodiments of the present disclosure do not make any limit to it.

For example, the insulating layer 103 covers the driving circuit 102 so as to protect the driving circuit 102 and planarize the driving circuit 102.

In the display panel provided by some embodiments of the present disclosure, the insulating layer 103 includes the groove 103A in the peripheral region 11, and thus, the groove 103A can collect the material of the light-emitting layer 1043. For example, in some embodiments, the second electrode 1044 and the passivation layer 1045 on the light-emitting layer 1043 also may adopt a full-surface forming mode, and thus, there also may be materials of the second electrode 1044 and the passivation layer 1045 in the groove 103A. Therefore, an undesired material such as the material of the light-emitting layer 1043 and the like cannot remain for example on the insulating layer 103 in the peripheral region 11, so that the sealant 106 can be directly adhered between the insulating layer 103 and the opposed substrate 105 to form better sealing and bonding effects, and for example, compared to a case that the undesired material remains on the insulating layer 103 in the peripheral region 11 to form a path for the impurities such as water, oxygen and the like to enter the display region, an enter path of water, oxygen and the like can be reduced. In another aspect, the sealant 106 also may be at least partially filled into the groove 103A, and the formation of the groove 103A also complicates an entering path of the impurities such as water, oxygen and the like below the sealant 106, thereby further reinforcing the sealing effect.

For example, in some embodiments, in order to increase the volume of the groove, the insulating layer may adopt a double-layer structure, and the groove is formed in the double-layer structure. This setting can further ensure that the undesired material cannot remain for example on the insulating layer in the peripheral region. In another aspect, in a case that a total volume of a plurality of grooves is constant, this setting can reduce the forming number of the grooves.

For example, as shown in FIG. 5B, the display panel provided by some embodiments of the present disclosure includes the substrate 1000, the opposed substrate 105 and the sealant 106, the opposed substrate is set to be opposite to the substrate, the sealant 106 is set between the substrate and the opposed substrate and for example, covers the groove 103A, and in the peripheral region, the opposed substrate 105 and the substrate 1000 are bonded to form the display panel 100 and the sealing is achieved.

Figure 7A:
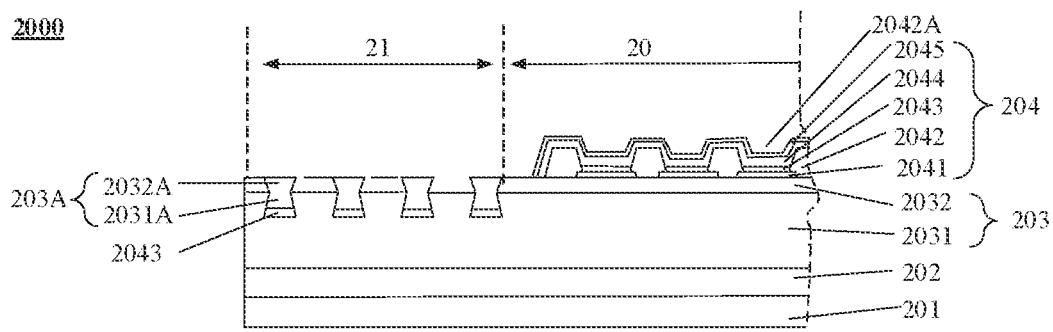
FIG. 7A is a cross-sectional schematic diagram of yet another substrate provided by some embodiments of the present disclosure.
Figure 7B:
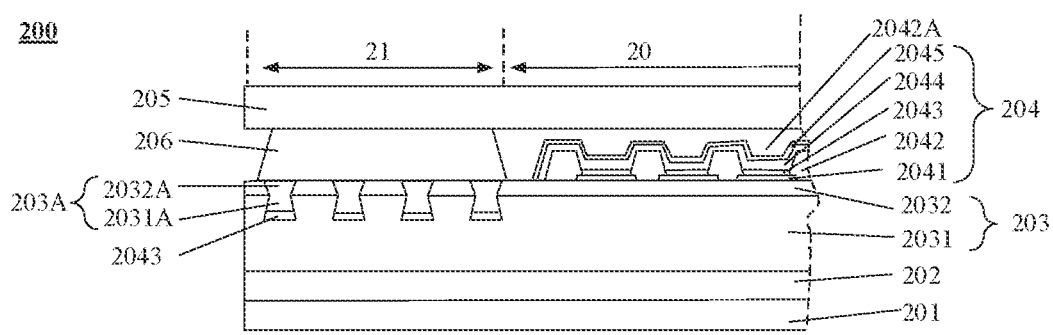
FIG. 7B is a cross-sectional schematic diagram of yet another display panel provided by some embodiments of the present disclosure.
Figure 7C:
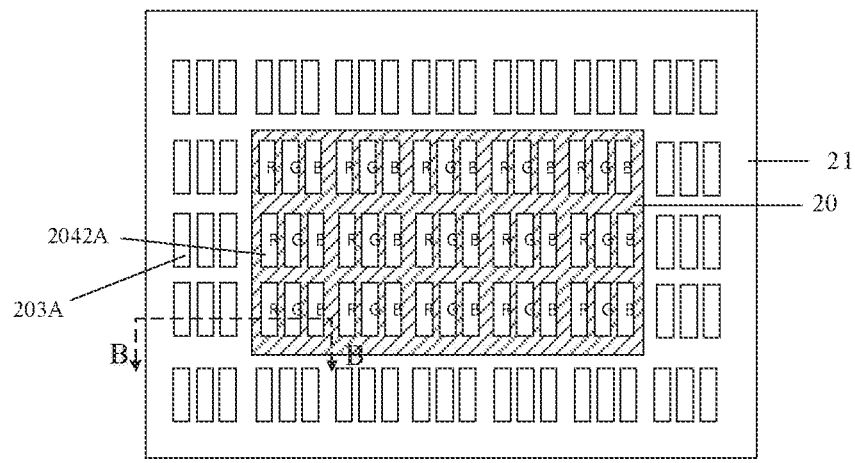
FIG. 7C is a plane schematic diagram of yet another display panel provided by some embodiments of the present disclosure.

For example, at least one embodiment of the present disclosure provides a substrate 2000, FIG. 7A is a cross-sectional schematic diagram of the substrate, FIG. 7B is a cross-sectional schematic diagram of a display panel including the substrate, and FIG. 7C is a plane schematic diagram of the display panel, wherein FIG. 7A is a cross-sectional schematic diagram of the display panel in FIG. 7C along a B-B line.

As shown in FIG. 7A, FIG. 7B and FIG. 7C, the substrate 2000 has a display region 20 and a peripheral region 21 for sealing, and the substrate 2000 includes an insulating layer 203 in the display region 20 and the peripheral region 21. The insulating layer 203 includes a groove 203A in the peripheral region 21, a light-emitting element layer 204 for a plurality of pixel units (RIG/B) is formed in the display region 20 and on the insulating layer 203, and the light-emitting element layer 204 includes a light-emitting layer 2043.

For example, the insulating layer 203 includes a first sub insulating layer 2031 and a second sub insulating layer 2032 laminated on the first sub insulating layer 2031. The first sub insulating layer 2031 has a first groove portion 2031A, the second sub insulating layer 2032 is laminated on the first sub insulating layer 2031 and has an opening 2032A communicating with the first groove portion 2031A, and the first groove portion 2031A and the opening 2032A constitute the groove 203A together. For example, a longitudinal cross-section of the first groove portion 2031A is of a regular trapezoid shape, and a longitudinal cross-section of the opening 2032A is of an inverted trapezoid or rectangle shape, so that the groove 203A has a large volume.

For example, as shown in FIG. 7A, the longitudinal cross-section of the opening 2032A is of an inverted trapezoid shape with a wide upper portion and a narrow lower portion, and the longitudinal cross-section of the first groove portion 2031A is of a regular trapezoid shape with a narrow upper portion and a wide lower portion. For example, a size of a lower end of the opening 2032A is basically the same with that of an upper end of the first groove portion 2031A, and thus, a cross-section of the obtained groove 203A is of an hourglass shape. In this embodiment, the groove 203A has a larger volume, and compared to the case shown in FIG.

5A for example, an entering path of the impurities such as water, oxygen and the like is more complex.

In some embodiments, for example, a material of the first sub insulating layer 2031 includes a negative photoresist material, which benefits for forming the first groove portion 2031A which has the narrow upper portion and the wide lower portion and has a larger volume in the preparation process. A material of the second sub insulating layer 2032 includes a positive photoresist material or includes an inorganic material. For example, the negative photoresist material includes phenolic resin and the like, the positive photoresist material includes polyimide, polyacrylate and the like, and the inorganic material includes SiOx, SiNx, $Al_2O_3$ and the like. When the photoresist material exposes, an exposing amount of a material on a surface layer is larger, and thus, after development, due to different exposure intensities of upper and lower portions, a longitudinal cross-section which is of a trapezoid shape with a bevel edge is formed.

For example, in some embodiments of the present disclosure, the substrate further includes a pixel definition layer 2042, the pixel definition layer 2042 includes a plurality of pixel openings 2042A respectively used for defining a plurality of pixel units, the light-emitting layer 2043 at least covers the plurality of pixel openings 2042A. For example, the light-emitting element layer 204 further includes a first electrode 2041 and a second electrode 2044 for driving the light-emitting layer 2043 to emit light, and further includes a passivation layer 2045 which may be covered on the light-emitting layer 2043 so as to form packaging and protection.

For example, in the preparation process of the display panel provided by some embodiments of the present disclosure, the light-emitting layer 2043 is formed by using a full-surface forming mode and for example, by using printing modes of ink-jet printing, spin-coating, spray-coating and the like, and thus, a material of the light-emitting layer 2043 can flow into the peripheral region 21 for sealing, and at the moment, the groove 203A in the insulating layer 203 can collect the material of the light-emitting layer 2043, which flows into the peripheral region 21, so that the material of the light-emitting layer 2043 cannot remain for example on the insulating layer 203 in the peripheral region 21. At the moment, in some embodiment, the light-emitting layer 2043 at least partially extends into the groove 203A.

For example, in some embodiments of the present disclosure, a surface of the insulating layer 203, which is positioned in the peripheral region 21, has lyophobicity. For example, the first sub insulating layer 2031 of the insulating layer 203 is formed by adopting a material with lyophobicity, or a surface of the first sub insulating layer 2031, which is positioned in the peripheral region 21, is subjected to surface treatment so as to have lyophobicity. At the moment, the surface of the insulating layer 203, which has lyophobicity, can promote the material of the light-emitting layer 2043 to flow into the groove 203A, so that the material of the light-emitting layer 2043, which flows to the peripheral region 21, sufficiently flows into the groove 203A, thereby ensuring that the material of the light-emitting layer 2043 cannot remain on the insulating layer 203 in the peripheral region 21.

For example, in some embodiments of the present disclosure, the groove 203A and the pixel opening 2042A are the same in plane shape and size, or the plane size of the groove 203A is greater than that of the pixel opening 2042A. In this embodiment, the plane shape of the groove 203A refers to a shape of the second sub insulating layer 2032 in an upper layer of the groove 203A, which is shown in the plane diagram of the groove 203A, i.e., a plane shape of the uppermost portion of the second sub insulating layer 2032, and a plane shape of the pixel opening refers to a shape of the pixel opening shown in the plane diagram of the pixel opening, that is, a shape of the uppermost portion of the pixel opening, for example, as shown in FIG. 7C, the plane shapes of the groove 203A and the pixel opening 2042A are rectangles, and in other embodiments, the plane shapes of the groove 203A and the pixel opening 2042A also may be circles, ovals or irregular shapes and the like, and the embodiments of the present disclosure do not make any specific limit to it. The plane size of the groove 203A refers to an area occupied by the shape of the second sub insulating layer 2032 in the upper layer of the groove 203A, which is shown in the plane diagram of the groove 203A, the plane size of the pixel opening 2042A refers to a size (for example, a length, a width and the like) of the shape of the pixel opening 2042A, which is shown in the plane diagram of the pixel opening 2042A, at the same dimension, e.g., the sizes of the length and the width of the rectangle shape or the area of the rectangle shape, as shown in FIG. 7. In the embodiments of the present disclosure, the plane shapes and the plane sizes of the groove 203A and the pixel opening 2042A may be selected according to actual demands, for example, in some embodiments, the plane size of the groove 203A also may be smaller than that of the pixel opening 2042A, and the embodiments of the present disclosure do not make any specific limit to it.

For example, in some embodiments, the insulating layer 203 includes a plurality of grooves 203A in the peripheral region 21, and the plurality of grooves 203A are arranged around the display region 20. For example, the plurality of pixel openings 2042A are arranged in a first array, the plurality of grooves 203A are arranged in a second array, the first array and the second array have the same arrangement direction and have the same pitch in the arrangement direction, i.e., the plurality of pixel openings 2042A and the plurality of grooves 203A adopt the basically same arrangement mode. For example, when the plane shapes of the groove 203A and the pixel opening 2042A are rectangles, an extending direction of a length of the rectangle of the groove 203A is the same with an extending direction of a length of the rectangle of the pixel opening 2042A, and an extending direction of a width of the rectangle of the groove 203A is the same with an extending direction of a width of the rectangle of the pixel opening 2042A, and a spacing between the adjacent grooves 203A is basically the same with that between the adjacent pixel opening 2042A.

Under the above-mentioned setting, when the light-emitting layer 2043 is formed in the pixel opening 2042A, the groove 203A in the peripheral region 21 can better collect the material of the light-emitting layer 2043 formed on the insulating layer 203 in the peripheral region 21 so as to ensure that the material of the light-emitting layer 2043 cannot remain for example on the insulating layer 203 in the peripheral region 21.

For example, the substrate 2000 provided by this embodiment further includes a base substrate 201 and a driving circuit 202. The base substrate 201 is used for supporting the display region 20 and the peripheral region 21; and the driving circuit 202 is positioned on the base substrate 201 and used for driving a plurality of pixel units. For example, the driving circuit 202 includes a pixel driving circuit for the pixel unit, the driving circuit includes structures such as a thin film transistor, a capacitor and the like and may be formed in a form of 2T1C, 3T1C and the like, and the embodiments of the present disclosure do not make any limit to it. For example, the insulating layer 203 covers the driving circuit 202 so as to protect the driving circuit 202. For example, the first sub insulating layer 2031 of the insulating layer 203 is positioned on the driving circuit 202 and planarizes the driving circuit 202, and the second sub insulating layer 2032 is positioned on the first sub insulating layer 2031 for forming the groove 203A.

For example, a display panel 200 provided by some embodiments of the present disclosure includes the substrate 2000, an opposed substrate 205 and a sealant 206, the opposed substrate is set to be opposite to the substrate, and the sealant 206 is disposed between the substrate and the opposed substrate and for example, covers the groove 203A and bonds the substrate 2000 with the opposed substrate 205 together.

The first substrate 1000 and the second substrate 2000 are different in the structure of the insulating layer, and are all the same in other members and structures, which are not repeated herein and may refer to related descriptions in the first substrate 1000.

In the substrate and the display panel provided by some embodiments of the present disclosure, the insulating layer 203 includes the groove 203A with the double-layer structure in the peripheral region 21, and thus, the groove 203A can collect the material of the light-emitting layer 2043. For example, in some embodiments, the second electrode 2044 and the passivation layer 2045 on the light-emitting layer 2043 also may adopt a full-surface forming mode, and thus, there also may be materials of the second electrode 2044 and the passivation layer 2045 in the groove 203A. Therefore, the undesired material such as the material of the light-emitting layer 2043 and the like cannot remain for example on the insulating layer 203 in the peripheral region 21, so that the sealant 206 can be directly adhered between the insulating layer 203 and the opposed substrate 205 to form better sealing, and for example, compared to a case that the undesired material remains on the insulating layer 203 in the peripheral region 21, an enter path of the impurities such as water, oxygen and the like can be reduced. In another aspect, the formation of the groove 203A also complicates the entering path of the impurities such as water, oxygen and the like below the sealant 206, thereby further reinforcing the sealing effect.

At least one embodiment of the present disclosure provides a preparation method of a display panel. The preparation method includes: forming a display region and a peripheral region for sealing; and the forming the display region and the peripheral region for sealing includes: forming an insulating layer in the display region and the peripheral region, forming a groove in the insulating layer in the peripheral region, and forming a light-emitting element layer for a plurality of pixel units on the insulating layer in the display region, the light-emitting element layer including a light-emitting layer.

An embodiment of the present disclosure further provides a preparation method of a substrate. The substrate includes a display region and a peripheral region positioned in the periphery of the display region and used for sealing. The preparation method includes: providing a base substrate; forming an insulating layer in the display region and the peripheral region on a side of the base substrate; and forming at least one groove in the peripheral region and on a side of the insulating layer which faces away from the base substrate, a side of the groove, which is away from the base substrate, being open, a depth direction of the groove being perpendicular to the base substrate, wherein the substrate includes a plurality of pixel units, and the plurality of pixel units are positioned on the insulating layer corresponding to the display region.

For example, the insulating layer is configured that at least a surface of the insulating layer in the peripheral region is lyophobic.

For example, the preparation method of the substrate further includes: forming a pixel definition layer, the pixel definition layer including a plurality of pixel openings respectively used for the plurality of pixel units; and forming a light-emitting layer, the light-emitting layer at least covering the plurality of pixel openings, wherein the light-emitting layer is formed by using an ink-jet printing, spin-coating or spray-coating mode, and at least one portion of the light-emitting layer is formed in the groove.

For example, the forming the insulating layer includes: forming a first sub insulating layer, the first sub insulating layer having a first groove portion; and forming a second sub insulating layer on the first sub insulating layer, the second sub insulating layer having an opening communicating with the first groove portion, wherein the first groove portion and the opening constitute the groove.

For example, the second sub insulating layer is formed by adopting a material with lyophobicity, or a surface of the second sub insulating layer, which is positioned in the peripheral region, is subjected to surface treatment, so that the surface of the second sub insulating layer, which is positioned in the peripheral region, has lyophobicity.

For example, the surface treatment is carried out by adopting plasmas of Ar, $N_2$, $CF_4$ or $O_2$.

The preparation provided by this embodiment will be illustrated below by taking the substrate shown in FIG. 7A and FIG. 7C as an example.

Figure 8A:
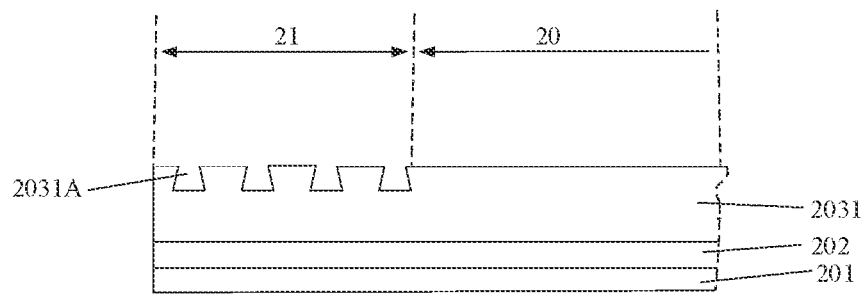
FIGS. 8A to 8D are cross-sectional schematic diagrams of a display panel in the preparation process, as provided by some embodiments of the present disclosure.

For example, as shown in FIG. 8A, firstly, the base substrate 201 is provided, and then the display region 20 and the peripheral region 21 are formed in different regions of the base substrate 201. For example, the base substrate 201 adopts a glass substrate, a quartz substrate, a plastic substrate and the like, and the embodiments of the present disclosure do not make any specific limit to it.

For example, the driving circuit 202 for a plurality of pixel units in the display region 20 is formed on the base substrate 201. For example, the driving circuit 202 includes the pixel driving circuit for the pixel unit, the pixel driving circuit includes structures such as a thin film transistor, a capacitor and the like, the driving circuit further may include signal lines such as a gate line, a data line and the like and may be formed by adopting a semiconductor preparation process, and the embodiments of the present disclosure do not make any limit to it.

For example, the first sub insulating layer 2031 is formed on the driving circuit 202, and the step includes: forming a first sub insulation material layer on the driving circuit 202, and then patterning the first sub insulation material layer so as to form the first groove portion 2031A.

For example, the first sub insulating layer 2031 is formed by adopting a negative photoresist material and for example, adopting phenolic resin and the like. At the moment, the patterning the first sub insulation material layer includes: exposing the first sub insulation material layer by a mask, and then performing development so as to form the first groove portion 2031A. The first groove portion 2031A is of a structure with a narrow upper portion and a wide lower portion, and thus has a larger volume.

Figure 8B:
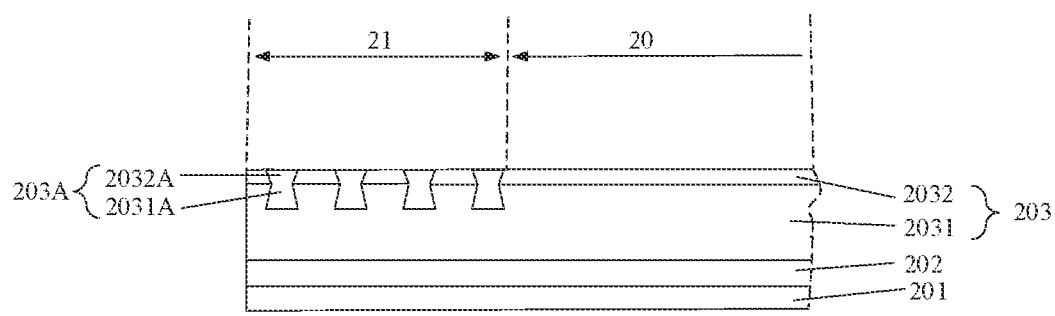

As shown in FIG. 8B, after the first sub insulating layer 2031 is formed, the second sub insulating layer 2032 may be formed on the first sub insulating layer 2031, and the step includes: forming a second sub insulation material layer on the first sub insulating layer 2031, and then patterning the second sub insulation material layer so as to form the opening 2032A communicating with the first groove portion 2031A.

For example, the second sub insulating layer 2032 is formed by adopting a positive photoresist material or an inorganic material and for example, adopting the positive photoresist material such as polyimide, polyacrylate and the like, or the inorganic materials such as SiOx, SiNx, $Al_2O_3$ and the like. For example, when the second sub insulating layer 2032 is formed by adopting the positive photoresist material, the patterning the second sub insulation material layer includes: exposing and developing the second sub insulation material layer by the mask so as to form the opening 2032A. When the second sub insulating layer 2032 is formed by adopting the inorganic material, the patterning the second sub insulation material layer includes: forming a layer of photoresist on the second sub insulation material layer, then exposing and developing the photoresist by the mask so as to form a photoresist pattern, and then performing etching on the second sub insulation material layer by the photoresist pattern so as to form the opening 2032A; and the etching, for example, adopts a dry etching or a wet etching, and the embodiments of the present disclosure do not make any limit to it. The first groove portion 2031A and the opening 2032A constitute the groove 203A in the insulating layer 203.

For example, the insulating layer 203 is configured that at least a surface in the peripheral region 21 is lyophobic. At the moment, the second sub insulating layer 2032 positioned at an upper portion of the insulating layer 203 is formed by adopting a material with lyophobicity (for example, the materials illustrated above), or a surface of the second sub insulating layer 2032, which is positioned in the peripheral region 21, is subjected to surface treatment, so that the surface of the second sub insulating layer 2032, which is positioned in the peripheral region 21, is lyophobic.

For example, the surface of the second sub insulating layer 2032, which is positioned in the peripheral region 21, may be subjected to a surface treatment by adopting plasmas of Ar, $N_2$, $CF_4$ or $O_2$, so that the surface of the second sub insulating layer 2032, which is positioned in the peripheral region 21, is lyophobic. For example, when the second sub insulating layer 2032 is formed by adopting the material with lyophobicity, different materials with lyophobicity have different lyophobic degrees for different fluids formed thereon, and thus, the corresponding materials may be selected as required; or, the surface of the second sub insulating layer 2032 formed by adopting the material with lyophobicity also may be subjected to lyophobic treatment so as to further improve lyophobicity of the surface of the second sub insulating layer 2032.

Figure 8C:
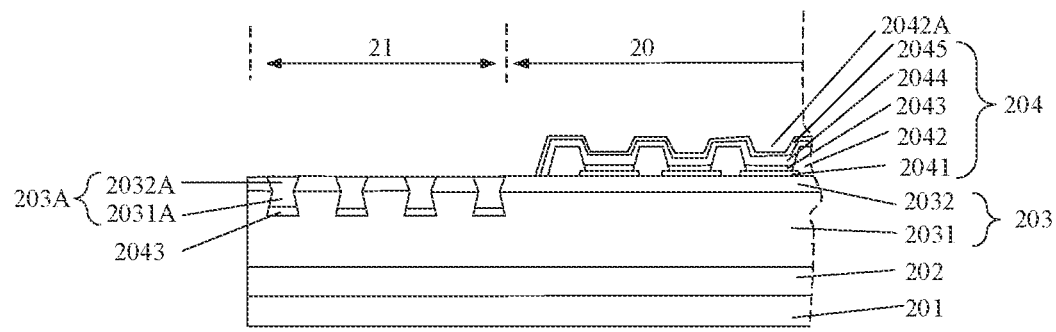

As shown in FIG. 8C, the light-emitting element layer 204 is formed on a portion of the insulating layer 203, which is positioned in the display region 20. For example, firstly, the first electrode 2041 is formed, the first electrode 2041 includes a plurality of sub electrodes corresponding to a plurality of pixel units; and then the pixel definition layer 2042 is formed, the pixel definition layer 2042 includes a plurality of pixel openings 2042A respectively used for a plurality of pixel units, the plurality of pixel openings 2042A respectively expose a plurality of sub electrodes of the first electrode 2041, and the light-emitting layer 2043 is configured to at least cover a plurality of pixel openings 2042A; and then the second electrode 2043 and the passivation layer 2044 are formed on the light-emitting layer 2043.

For example, the first electrode 2041 and the pixel definition layer 2042 may be formed by adopting the patterning process, a material of the first electrode 2041, for example, includes metal oxide such as ITO, IZO and the like or metal such as Ag, Al, Mo and the like or alloy thereof, and a material of the pixel definition layer 2042, for example, includes an organic material such as polyimide and the like or an inorganic material such as silicon oxide, silicon nitride and the like.

For example, the light-emitting layer 2043 may be formed by using a printing mode such as ink-jet printing, spin-coating or spray-coating and the like, and due to fluidity of printed ink, the material of the printed light-emitting layer 2043 also extends into the groove 203A. The material of the light-emitting layer 2043 is correspondingly selected according to a type of a to-be-formed light-emitting element. For example, when an OLED is to be formed, an organic light-emitting material is used, and the light-emitting layer may be a composite layer and for example, includes an electron injection sub layer, an electron transport sub layer, a light-emitting sub layer, a hole transport sub layer, a hole injection sub layer and the like; and for further example, when the QLED is to be formed, a quantum dot light-emitting material is used. The embodiments of the present disclosure do not make any limit to the material of the light-emitting layer. For example, the second electrode 2044 and the passivation layer 2045 may be formed by the mask respectively in modes of evaporation, sputtering or deposition and the like. For example, a material of the second electrode 2044 includes metal such as Mg, Ca, Li or Al and the like or alloy thereof, or an inorganic material with conductivity, such as IZO, ZTO and the like, or an organic material with conductivity, such as (poly 3,4-ethylenedioxy-thiophene/polystyrene sulfonate) (PEDOT/PSS) and the like, and a material of the passivation layer 2045 includes an organic material such as polyimide and the like or an inorganic material such as silicon oxide, silicon nitride and the like.

Figure 8D:
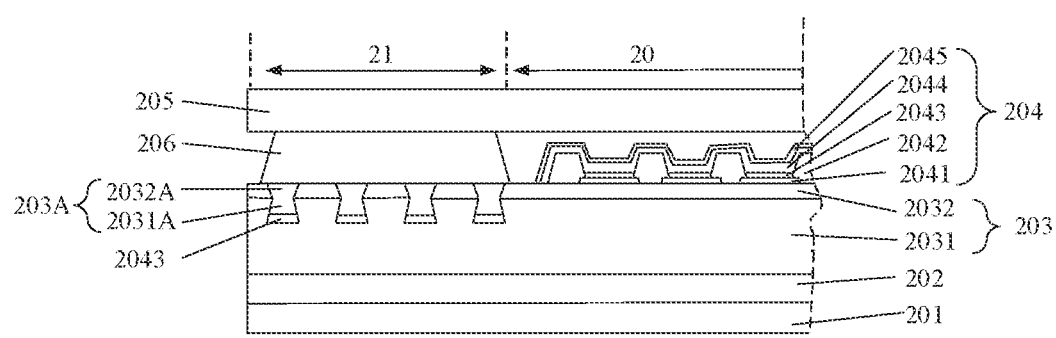

Further, an embodiment of the present disclosure further provides a preparation method of a display panel, including: manufacturing the substrate, the substrate being prepared by any one of the above-mentioned preparation methods; and providing an opposed substrate, and bonding the opposed substrate on the display panel by a sealant, wherein the sealant covers the groove. For example, the preparation method is described with reference to the drawing, and as shown in FIG. 8D, after the light-emitting element layer 204 is formed, the preparation method of the display panel, after the preparation method of the substrate, further includes: providing the opposed substrate 205, and bonding the opposed substrate 205 on the substrate by the sealant 206; for example, the sealant 206 is coated in the peripheral region according to a preset pattern and covers the groove 203A so as to be at least partially filled into and cover the groove 203A; and for example, according to a type of the sealant, the sealant may be subjected to ultraviolet lighting curing or thermocuring. For example, a material of the opposed substrate 205 includes a glass plate, a plastic plate or a plastic film, for example, a plastic material may adopt a transparent material such as polyethylene terephthalate (PET) or polyimide (PI) and the like, and the material of the sealant 206 includes a material being adhesive, such as resin and the like.

In some embodiments of the present disclosure, the groove 203A of the insulating layer 203, which is positioned in the peripheral region 21, can collect the material of the light-emitting layer 2043 formed in the peripheral region 21 when the light-emitting element layer 204 is formed, and thus, for example, the undesired material cannot remain for example on a portion of the insulating layer 203, which is positioned in the peripheral region 21, and at the moment, the sealant 206 may directly bond the opposed substrate 205 with the insulating layer 203 so as to have a better packaging effect.

For example, in some embodiments, the second electrode 2044 and/or the passivation layer 2045 also may be formed into one whole surface in modes of evaporation, sputtering or deposition and the like, and at the moment, there is also a forming material of the second electrode 2044 and/or the passivation layer 2045 in the groove 203A.

Figure 9:
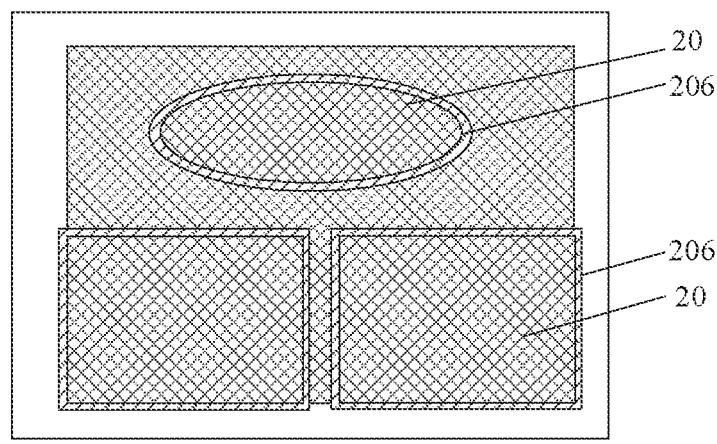
FIG. 9 is a plane schematic diagram in which a plurality of display panels are simultaneously formed, as provided by some embodiments of the present disclosure.

In some embodiments of the present disclosure, a portion of the insulating layer 203, which is positioned in the peripheral region 21, has the groove 203A, and thus, the groove 203A can collect the undesired material formed on a portion of the insulating layer 203, which is positioned in the peripheral region 21. As shown in FIG. 9, the preparation method may be used for using one mother board and simultaneously preparing a plurality of display panels by the mother board, those display panels may be of the same shape or different shapes, and then those display panels may be separated from each other by a cutting process. For example, in FIG. 9, three display panels are prepared on the same mother board, and include an oval display panel on an upper side and two rectangular display panels on a lower side. In each display panel, the sealant 206 surrounds the display region 20 and covers the groove in the peripheral region. For example, in some embodiments, the display panel also may be of an irregular shape, and at the moment, even though one whole surface of functional layer, such as the light-emitting layer 2043 and the like, is formed, due to a collection effect of the groove 203A, the material of the functional layer such as the light-emitting layer 2043 and the like, for example, also cannot remain on a portion of the insulating layer 203, which is positioned in the peripheral region 21, so as not to influence the packaging effect of the sealant 206. Therefore, the display panel prepared by the preparation method provided by the embodiments of the present disclosure has a better packaging effect, and a plurality of display panels can be simultaneously formed by utilizing the preparation method, thereby improving production efficiency.

Figure 10:
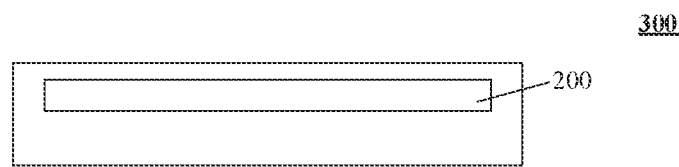
FIG. 10 is a schematic diagram of a display device provided by some embodiments of the present disclosure.

At least one embodiment of the present disclosure further provides a display device. As shown in FIG. 10, a display device 300 includes any one of the display panels provided by the embodiments of the present disclosure, and a display panel 200 is shown in the drawing. The display device 300 may be any product or part with a display function, such as a mobile phone, a tablet personal computer, a television, a display, a notebook computer, a digital photo frame, a navigator and the like, and the embodiments of the present do not make any limit to it.

The following statements should be noted:
(1) The accompanying drawings involve only the structure(s) in connection with the embodiment(s) of the present disclosure, and other structure(s) can be referred to common design(s).
(2) For the purpose of clarity only, in accompanying drawings for illustrating the embodiment(s) of the present disclosure, the thickness of a layer or a region may be enlarged or reduced, that is, the accompanying drawings are not drawn according to the actual scale.
(3) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims.

This application claims priority to Chinese Patent Application No. 201811496810.5 filed Dec. 7, 2018, the disclosure of which is incorporated herein by reference as part of the application.

What is claimed is:

1. A substrate, comprising a display region and a peripheral region positioned in a periphery of the display region and used for sealing, the substrate comprising:
   a base substrate;
   an insulating layer, arranged on a side of the base substrate and positioned in the display region and the peripheral region;
   a plurality of pixel units, positioned on the insulating layer corresponding to the display region;
   a pixel definition layer, positioned on the insulating layer corresponding to the display region, the pixel definition layer including a plurality of pixel openings for defining the plurality of pixel units,
   wherein in the peripheral region, at least one groove is disposed on a side of the insulating layer which faces away from the base substrate,
   wherein the peripheral region for sealing is a sealant set region, and
   each of the plurality of pixel units includes:
   a light-emitting element layer, arranged on a side of the insulating layer which faces away from the base substrate, the light-emitting element layer including a light-emitting layer, wherein the light-emitting layer is for a light-emitting element and the light-emitting element is an Organic Light-Emitting Diode (OLED) or a Quantum dot Light-Emitting Diode (QLED),
   the light-emitting layer at least covering the plurality of pixel openings,
   wherein the substrate further comprises a sealant, the sealant being disposed on a side of the insulating layer away from the base substrate and a material of the sealant being distributed in the at least one groove,
   wherein a shape and a size of an end of the at least one groove away from the base substrate are identical to shapes and sizes of ends of the plurality of pixel openings away from the base substrate; or
   the shape of the end of the at least one groove away from the base substrate is identical to the shapes of the ends of the plurality of pixel openings away from the base substrate, the size of the end of the at least one groove away from the base substrate is being greater than sizes of the ends of the plurality of pixel openings away from the base substrate.

2. The substrate according to claim 1, wherein an extending direction of the at least one groove is parallel to a plane where the base substrate is positioned, and on a plane perpendicular to the base substrate, a longitudinal cross-section of the at least one groove is of a regular trapezoid or inverted trapezoid shape.

3. The substrate according to claim 1, wherein the insulating layer includes a plurality of grooves in the peripheral region, each groove of plurality of grooves is one of the at least one groove,
   extending directions of the plurality of grooves being identical, the plurality of grooves being arranged into a plurality of rows and a plurality of columns in the peripheral region, a row direction of the grooves being identical with a row direction of the plurality of pixel openings, and a column direction of the grooves being identical with a column direction of the pixel openings.

4. The substrate according to claim 3, wherein the sizes of the ends of the plurality of grooves away from the base substrate are equal to the sizes of the ends of the plurality of pixel openings away from the base substrate, the shapes of the plurality of grooves are identical and the sizes of the plurality of grooves are identical, a pitch of the grooves in the row direction is identical with a pitch of the pixel openings in the row direction and/or a pitch of the grooves in the column direction is identical with that of the pixel openings in the column direction.

5. The substrate according to claim 1, wherein a surface of the insulating layer which is positioned in the peripheral region has lyophobicity.

6. The substrate according to claim 1, wherein at least one portion of the light-emitting layer is positioned in the groove.

7. The substrate according to claim 1, wherein the insulating layer includes:
- a first sub insulating layer, having a first groove portion; and
- a second sub insulating layer, laminated on the first sub insulating layer and having an opening communicating with the first groove portion,
- the first groove portion and the opening constituting the groove.

8. The substrate according to claim 7, wherein a longitudinal cross-section of the first groove portion is of a regular trapezoid shape, and a longitudinal cross-section of the opening is of an inverted trapezoid or rectangle shape,
wherein a material of the first sub insulating layer includes a negative photoresist material, and a material of the second sub insulating layer includes a positive photoresist material or an inorganic material.

9. A display panel, comprising:
the substrate according to claim 1;
an opposed substrate, arranged to be opposite to the substrate; and
the sealant, disposed between the substrate and the opposed substrate,
wherein the sealant bonds the opposed substrate with the substrate,
wherein the display panel is an Organic Light-Emitting Diode (OLED) display panel or a Quantum dot Light-Emitting Diode (QLED) display panel.

10. A display device, comprising the display panel according to claim 9, the display device is an Organic Light-Emitting Diode (OLED) display device or a Quantum dot Light-Emitting Diode (QLED) display device.

11. A substrate, comprising a display region and a peripheral region positioned in a periphery of the display region and used for sealing, the substrate comprising:
a base substrate;
an insulating layer, arranged on a side of the base substrate and positioned in the display region and the peripheral region;
a plurality of pixel units, positioned on the insulating layer corresponding to the display region;
a pixel definition layer, positioned on the insulating layer corresponding to the display region, the pixel definition layer including a plurality of pixel openings for defining the plurality of pixel units,
wherein in the peripheral region, at least one groove is disposed on a side of the insulating layer which faces away from the base substrate,
wherein the peripheral region for sealing is a sealant set region, and
each of the plurality of pixel units includes:
a light-emitting element layer, arranged on a side of the insulating layer which faces away from the base substrate, the light-emitting element layer including a light-emitting layer, wherein the light-emitting layer is for a light-emitting element and the light-emitting element is an Organic Light-Emitting Diode (OLED) or a Quantum dot Light-Emitting Diode (QLED),
the light-emitting layer at least covering the plurality of pixel openings,
wherein the substrate further comprises a sealant, the sealant being disposed on a side of the insulating layer away from the base substrate and a material of the sealant being distributed in the at least one groove,
wherein the insulating layer includes:
a first sub insulating layer, having a first groove portion; and
a second sub insulating layer, laminated on the first sub insulating layer and having an opening communicating with the first groove portion,
the first groove portion and the opening constituting the groove,
wherein a longitudinal cross-section of the first groove portion is of a regular trapezoid shape, and a longitudinal cross-section of the opening is of an inverted trapezoid or rectangle shape,
wherein a material of the first sub insulating layer includes a negative photoresist material, and a material of the second sub insulating layer includes a positive photoresist material or an inorganic material.

* * * * *